(12) United States Patent
Bohmer et al.

(10) Patent No.: US 10,186,645 B2
(45) Date of Patent: Jan. 22, 2019

(54) WHITE-APPEARING SEMICONDUCTOR LIGHT-EMITTING DEVICES HAVING A TEMPERATURE SENSITIVE LOW-INDEX PARTICLE LAYER

(71) Applicant: Lumileds LLC, San Jose, CA (US)

(72) Inventors: Marcel R. Bohmer, Eindhoven (NL); Kentaro Shimizu, San Jose, CA (US); Jacobus Johannes Franciscus Gerardus Heuts, Eindhoven (NL)

(73) Assignee: Lumileds LLC, San Jose, CA (US)

( * ) Notice: Subject to any disclaimer, the term of this patent is extended or adjusted under 35 U.S.C. 154(b) by 0 days.

(21) Appl. No.: 15/688,611

(22) Filed: Aug. 28, 2017

(65) Prior Publication Data
US 2018/0062052 A1    Mar. 1, 2018

Related U.S. Application Data

(60) Provisional application No. 62/382,426, filed on Sep. 1, 2016.

(30) Foreign Application Priority Data

Dec. 13, 2016    (EP) .................................... 16203756

(51) Int. Cl.
| | |
|---|---|
| *H01L 33/50* | (2010.01) |
| *H01L 33/60* | (2010.01) |
| *H01L 33/56* | (2010.01) |
| *H01L 33/44* | (2010.01) |

(52) U.S. Cl.
CPC .............. *H01L 33/60* (2013.01); *H01L 33/44* (2013.01); *H01L 33/50* (2013.01); *H01L 33/501* (2013.01); *H01L 33/502* (2013.01); *H01L 33/504* (2013.01); *H01L 33/56* (2013.01); *H01L 2933/0091* (2013.01)

(58) Field of Classification Search
None
See application file for complete search history.

(56) References Cited

U.S. PATENT DOCUMENTS

| | | | |
|---|---|---|---|
| 9,287,469 B2 * | 3/2016 | Chakraborty | ......... H01L 33/501 |
| 2009/0256167 A1 * | 10/2009 | Peeters | .................... H01L 33/44 |
| | | | 257/98 |
| 2009/0278147 A1 * | 11/2009 | Suzuki | .................... H01L 33/56 |
| | | | 257/98 |

(Continued)

FOREIGN PATENT DOCUMENTS

| | | |
|---|---|---|
| EP | 2980865 A2 | 2/2016 |
| EP | 3065188 A1 | 9/2016 |
| WO | 2016/139954 A1 | 9/2016 |

OTHER PUBLICATIONS

European Search Report dated Jun. 1, 2016 from European Patent Application No. 16203756.8, 7 pages.

*Primary Examiner* — Minh-Loan Tran
(74) *Attorney, Agent, or Firm* — Volpe and Koenig, P.C.

(57) ABSTRACT

Systems for LED illumination products. Solutions to the problems attendant to delivering a white-appearing LED product without diminishing efficiency of white light generation are presented. Devices are designed and manufactured that include a specially-formulated off-state white-appearing layer to the LED apparatus. The composition of the specially-formulated off-state white-appearing layer is tuned for high-efficiency during the on-state.

15 Claims, 15 Drawing Sheets

(56) References Cited

U.S. PATENT DOCUMENTS

2013/0207148 A1 8/2013 Kraeuter et al.
2014/0131739 A1 5/2014 Gebuhr et al.
2014/0203316 A1 7/2014 Ray
2015/0145406 A1 5/2015 Li et al.
2015/0300601 A1 10/2015 Windisch
2016/0260873 A1* 9/2016 Yamada ................ H01L 33/502

* cited by examiner

WHITE-APPEARING SEMICONDUCTOR LIGHT-EMITTING DEVICES HAVING A TEMPERATURE SENSITIVE LOW-INDEX PARTICLE LAYER

CROSS-REFERENCE TO RELATED APPLICATIONS

The present application claims priority to U.S. Provisional Patent Application No. 62/382,426, filed Sep. 1, 2016, and European Patent Application No. 16203756.8, filed Dec. 13, 2016. U.S. Provisional Patent Application No. 62/382,426 and European Patent Application No. 16203756.8 are incorporated herein.

FIELD OF INVENTION

This disclosure relates to LED illumination products, and more particularly to techniques for white-appearing LEDs using a temperature sensitive low-index particle layer.

BACKGROUND

Many of today's lighting needs are fulfilled using light-emitting diodes (LEDs). Indeed, LEDs have become ubiquitous throughout a wide range of applications. Commonly, blue-emitting LEDs are used and are coated with yellow or orange or red phosphors that serve to down convert the higher energy (e.g., near blue) photons to lower energy (e.g., near red) photons. In some applications, the yellow and/or orange and/or red phosphors are visible to the naked eye, which can detract from the cosmetic appearances. In certain applications (e.g., flash units in cameras, cell phone flash units, automotive headlamps, etc.) the phosphors are purposely covered with another layer that diffuses incident light sufficiently so that the undesired colors of the phosphors are not visible. In some cases, even when the additional diffusing layer completely covers the phosphors, the yellow/orange/red color "peeks" through. One approach to reduce peek-through is to make the diffusing layer thicker or denser. At some point the thickness or density of the diffusing layer produces enough scattering of incident light that there is no visible peek through of the yellow or orange phosphors.

Unfortunately, making the diffusing layer thicker and/or denser also reduces the operating efficiency of the LED device. More specifically, legacy uses of thicker and/or denser diffusing structures (e.g., scattering layer thicknesses, scattering particle density, etc.) that diffuse enough to reduce or eliminate peek-through also has the undesired effect of diffusing, scattering or absorbing light from the LED when in operation, thus reducing the efficiency of light production.

Improvements are needed.

SUMMARY

According to certain embodiments of the herein-disclosed white-appearing semiconductor light-emitting devices methods and apparatus are disclosed. Devices incorporate a specially-formulated off-state white-appearing layer into the LED apparatus. The off-state white-appearing layer is tuned for high-efficiency during the on-state. The present disclosure provides a detailed description of techniques used for forming and using white-appearing LEDs using a temperature sensitive low-index particle layer. The techniques advance the relevant technologies to address technological issues with legacy approaches.

In one aspect, a structure comprising a semiconductor light emitting device includes a wavelength-converting layer disposed in a path of light emitted by the semiconductor light emitting device. The structure also includes a light-scattering layer disposed in the path of light emitted by the semiconductor light emitting device wherein the light-scattering layer comprises a binding material having a first index of refraction at a first temperature and a concentration of scattering agents having a second index of refraction at the first temperature. In one aspect, the index of refraction of the scattering agents at the first temperature is lower than the index of refraction of the binding material at the same temperature.

Further details of aspects, objectives, and advantages of the technological embodiments are described herein and in the following descriptions, drawings, and claims.

BRIEF DESCRIPTION OF THE DRAWINGS

The drawings described below are for illustration purposes only. The drawings are not intended to limit the scope of the present disclosure Like reference characters shown in the figures designate the same parts in the various embodiments.

DETAILED DESCRIPTION

Some embodiments of the present disclosure address the problem of delivering a white-appearing LED product without diminishing efficiency of white light generation. Some embodiments are directed to approaches for adding a specially-formulated off-state white-appearing layer to the LED apparatus that is tuned for high-efficiency during the on-state. The accompanying figures and discussions herein present example structures, devices, systems, and methods for making and using white-appearing LEDs using temperature sensitive low-index particle layers.

Overview

Disclosed herein are techniques for forming a light-emitting device that has a white appearance at room temperature yet does not suffer from the severe loss of efficiency that is observed when using legacy techniques. Certain combinations of materials are used to form a diffusing or scattering layer. The materials are selected on the basis of their index of refraction. More specifically, materials are selected based on how their index of refraction changes over a range of temperatures.

Figure 1:
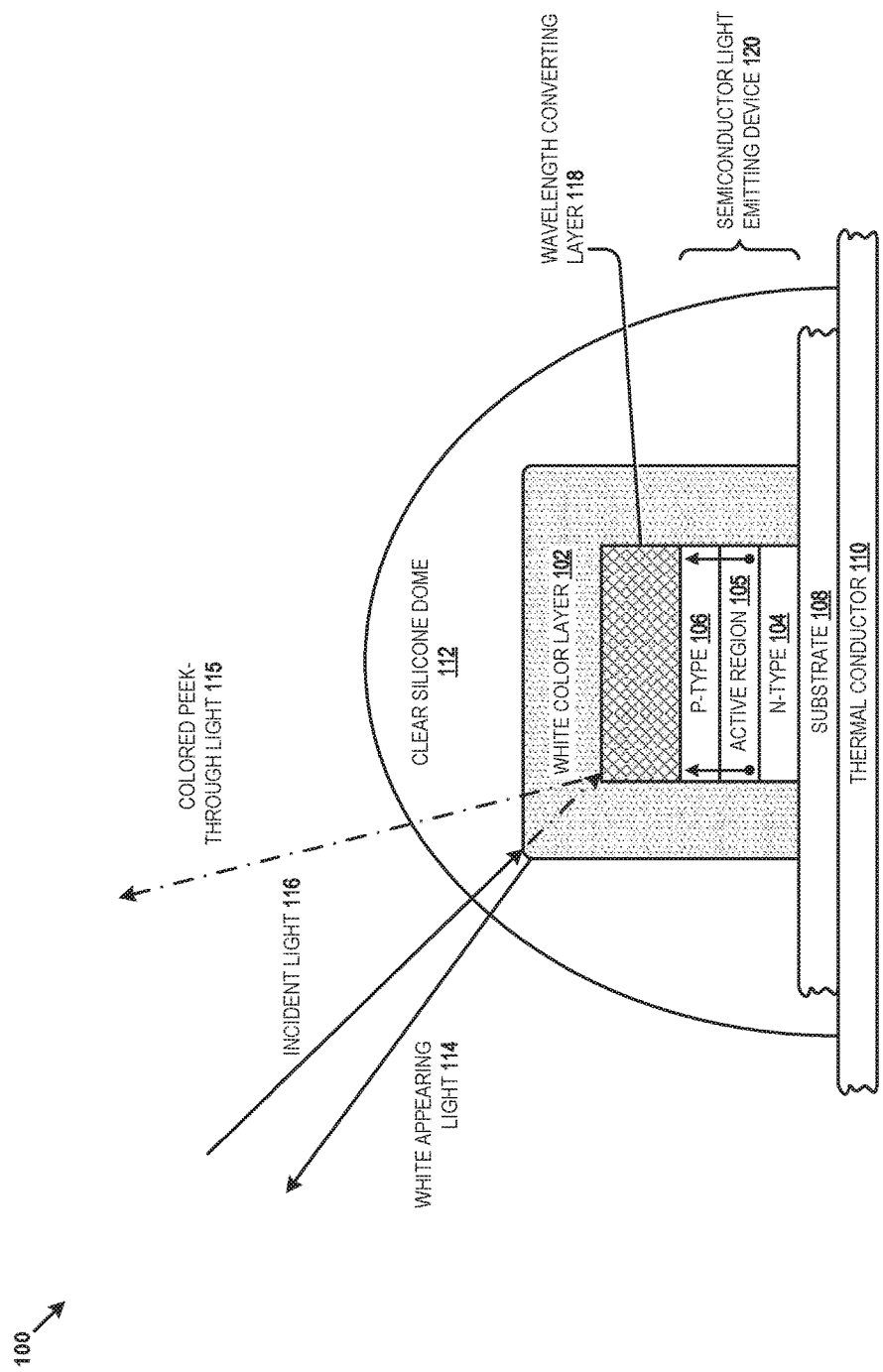
FIG. 1 depicts a light-emitting device structure in accordance with designs of white-appearing LEDs using a temperature sensitive low-index particle layer, according to an embodiment.

A white-light-emitting LED device is formed by disposing a wavelength-converting layer in the path of light emitted from the active region of the LED (see FIG. 1). An additional layer is formed covering the wavelength-converting layer so as to eliminate peek-through. Certain combinations of materials can be used in the additional layer so it appears in the off-state as white or near white due to the scattering effects of the materials selected. Such a layer might need to be relatively thick and/or relatively dense so as to eliminate peek-through and to appear white to an observer (e.g., to the naked eye at room temperature). Although adding greater thickness to this additional layer results in the desired effect of reduced peek-through, adding a greater thickness to this layer also reduces light output and overall efficiency of the LED, which is an undesired effect. In some cases the additional layer can be relatively thin and still avoid peek-through by loading a carrier with a relatively higher concentration of scattering particles. When a relatively thin layer is used, the LED application design must account for a first order effect on light output efficiency as the particle concentration increases (see FIG. 2). Designing an LED with respect to this first order effect becomes more complicated when considering that a white appearance is desired. A design tradeoff arises when considering that a subjectively white appearance of an LED apparatus and its LED efficiency are anti-correlated, thus presenting one of several tradeoffs involved in designing white-appearing semiconductor light-emitting devices having high efficiency at operating temperatures.

Tuning Scattering vs. Transparency

As light moves through two or more materials that have different indices of refraction, the light is scattered. If the two or more materials have matched or substantially matched indices of refraction, then light passes through the two materials with less scattering. Greater differences in the indices of refraction produces greater scattering (e.g., producing a whiter appearance). Lesser differences in the indices of refraction produces lesser scattering (more transparency). More specifically, the larger the difference between the index of refraction of the two materials, the larger the scattering effect. Thus, in many cases, the naive selection of a relatively high-index particle and a relatively low-index silicone carrier is made merely because scattering effects are higher (e.g., contributing to a more convincingly white appearance) than if a low-index particle were selected and loaded into the same silicone carrier (see FIG. 3A). Moreover, since the human brain-eye determination that an object is "white" is at least partially related to the reflectivity of the object, the aforementioned naive selection of a high-index particle is often made merely because reflectivity is higher than if a low-index particle were selected (see FIG. 3B). The aforementioned tradeoff between an acceptable or desired scattering effect (e.g., off-state white appearance) and an efficiency target can be tuned (see FIG. 4).

Surprisingly, some embodiments are formed using relatively lower-index particles, even though use of lower-index particles would require a relatively higher concentration of particles in the carrier to achieve the same degree of scattering as would be achieved using higher-index particles.

Phenomenon of Changing Index of Refraction Over a Temperature Variation

Some materials exhibit a large change in their index of refraction over a relatively narrow change in temperature (e.g., between 0° C. and 250° C.). Conversely, some materials exhibit only a small change in their index of refraction over the same temperature range. In the case of LED applications, the temperature range of interest is from about 20° C. (near room temperature) to about 250° C. (LED operating temperature). Consider a first material that varies only slightly over that temperature range and a second material that varies greatly over that same temperature range. If the two materials are combined, then the difference in respective index of refraction will vary greatly over the temperature range. Further consider selection of two materials such that at a relatively low temperature (e.g., room temperature) the indices of refraction differ greatly, and at a relatively higher temperature (e.g., operating temperature) the indices of refraction differ very little. In such a configuration the combined materials appear white (due to scattering) at room temperature and appear transparent at operating temperatures.

Observations

Figure 5:
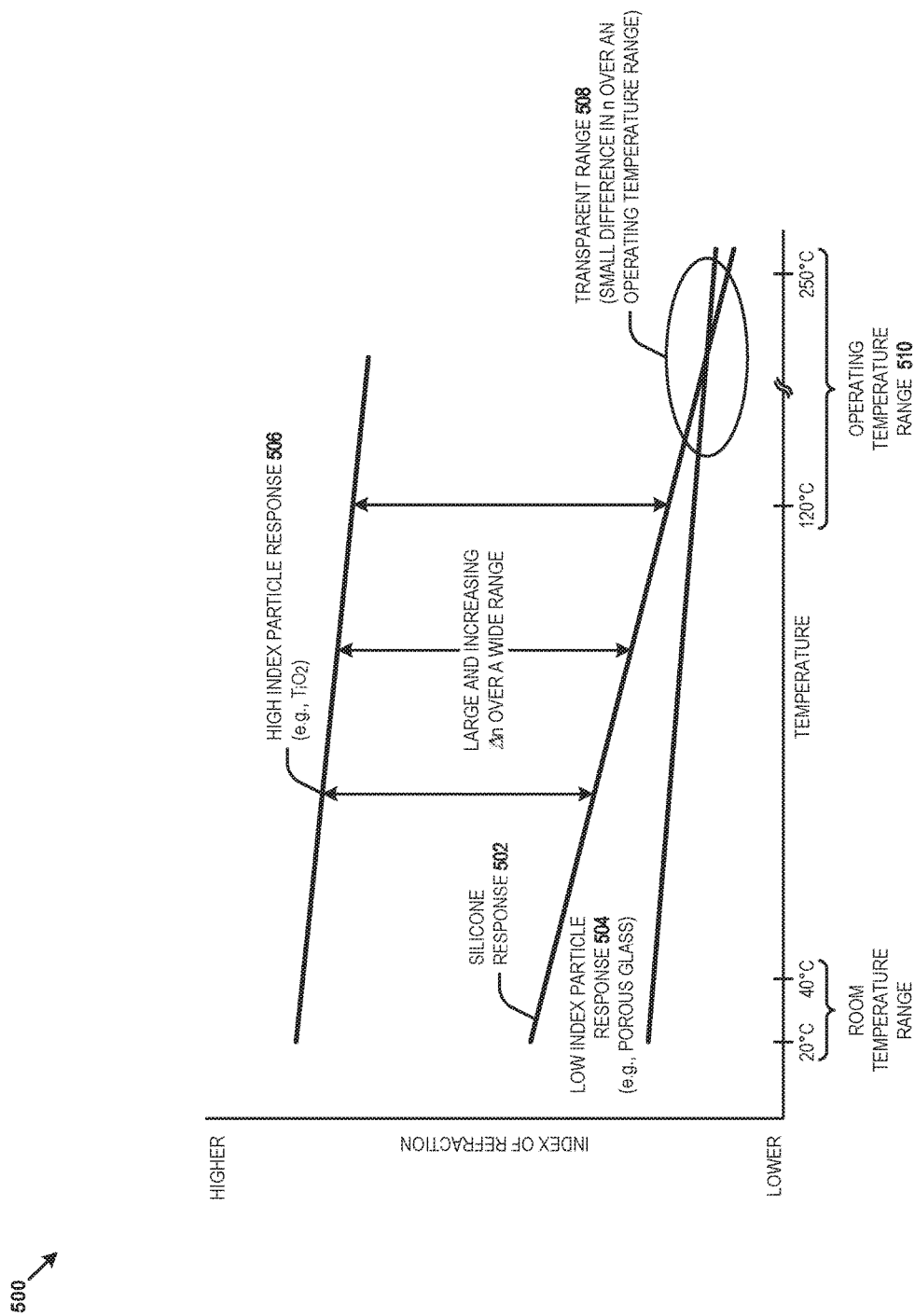
FIG. 5 is a material selection chart showing a selection of materials exhibiting transparency over an operating temperature range, according to an embodiment.

The index of refraction for many materials changes over a range of temperatures. Some materials exhibit a relatively large change in their index of refraction over a temperature range (e.g., materials where the matrix expands with higher temperatures), whereas some materials exhibit a relatively small change in their index of refraction over a temperature range. Of particular interest is the observation that many silicones exhibit a large reduction in their index of refraction as the temperature increases. A further observation is that there are many low-index particles that do not exhibit a significant change in their index of refraction over the temperature range of interest. FIG. 5 combines the aforementioned observations by showing a transparent range over the full span of LED operating temperatures (e.g., where there is a small or zero refractive index difference between the silicone and the low-index particles. Further inspection of FIG. 5 leads to the observation that at room temperatures, there is a relatively large difference in the index of refraction between the silicone and the low-index particles, thus resulting in scattering as incident light reflects off the particle-loaded silicone, such in the off-state at room temperatures.

Figure 6A:
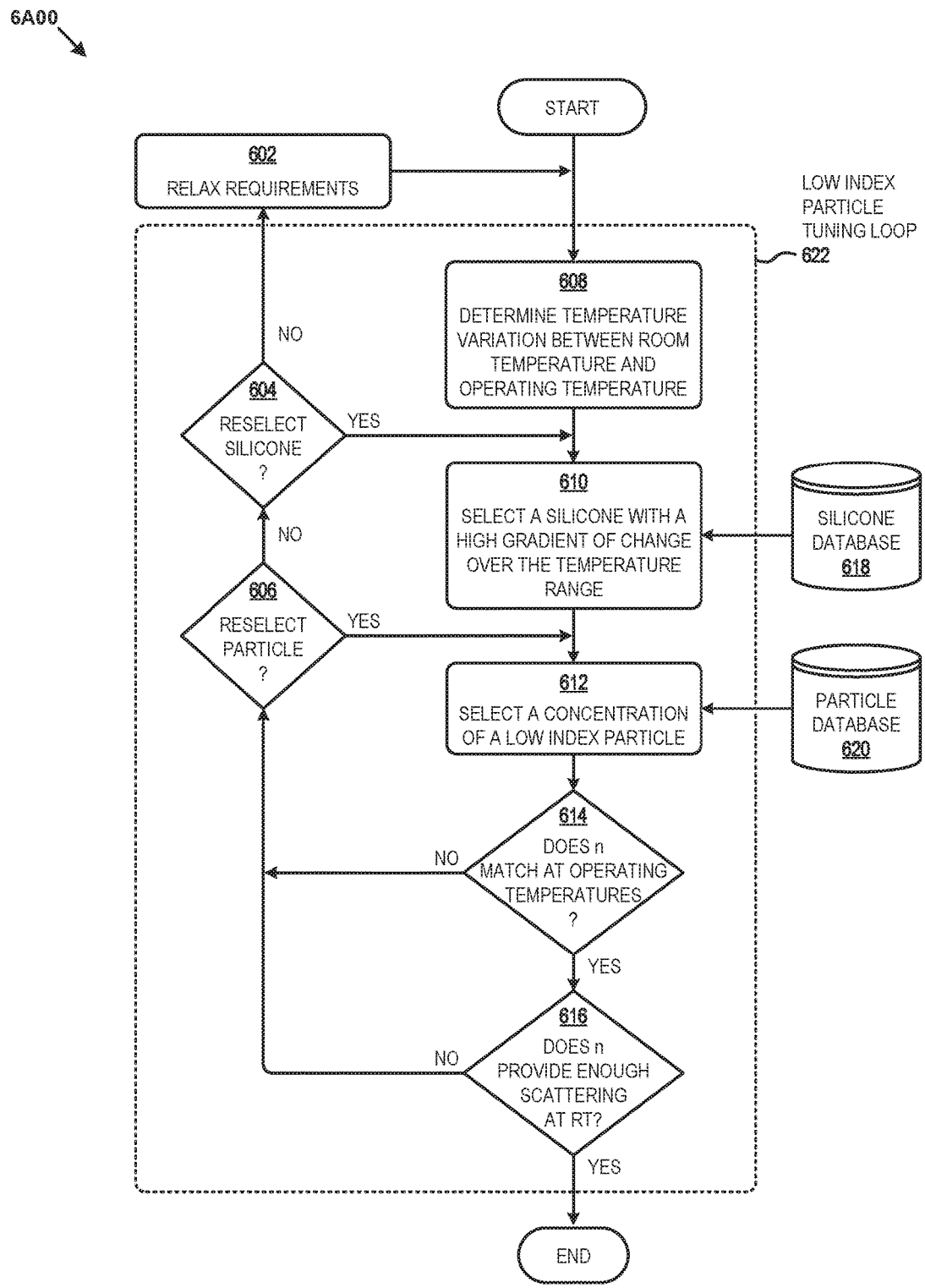
FIG. 6A is a flowchart showing a low-index particle selection technique for designing white-appearing LEDs using a temperature sensitive low-index particle layer, according to an embodiment.

There are many silicones and many low-index particles. FIG. 6A presents a selection technique that accounts for the many choices and combinations of particles and silicone carriers. Pairs of materials (e.g., a silicone and a scattering particle) can be considered for applicability to a particular LED application that has an a priori known operating temperature and a respective requirement for white-appearing color in the off-state (see FIG. 6A).

In the aforementioned discussion, the effect of index matching is dominant with respect to achieving transparency at operating temperatures. Effective selection of materials so as to achieve index matching of particles at operating temperature is merely one technique to achieve transparency at operating temperatures and reflectivity at lower temperatures. Another technique to achieve transparency at operating temperature and reflectivity at lower temperatures is to use phase change materials that exhibit changes in their index of refraction as the material undergoes phase changes from solid to liquid and back. Selection of phase change materials can be performed (see FIG. 6B). More specifically, pairs of materials (e.g., a silicone and a phase changing material) can be considered for applicability to a particular LED application that has an a priori known operating temperature and a respective requirement for white-appearing color in the off-state. The pairs of materials are selected based on a set of given design requirements and the criticality of achieving those design requirements over the lifetime and operating conditions of the intended LED application.

Various embodiments are described herein with reference to the figures. It should be noted that the figures are not necessarily drawn to scale and that elements of similar structures or functions are sometimes represented by like reference characters throughout the figures. It should also be noted that the figures are only intended to facilitate the description of the disclosed embodiments—they are not representative of an exhaustive treatment of all possible embodiments, and they are not intended to impute any limitation as to the scope of the claims. In addition, an illustrated embodiment need not portray all aspects or advantages of usage in any particular environment. An aspect or an advantage described in conjunction with a particular embodiment is not necessarily limited to that embodiment and can be practiced in any other embodiments even if not so illustrated. References throughout this specification to "some embodiments" or "other embodiments" refer to a particular feature, structure, material or characteristic described in connection with the embodiments as being included in at least one embodiment. Thus, the appearance of the phrases "in some embodiments" or "in other embodiments" in various places throughout this specification are not necessarily referring to the same embodiment or embodiments.

Definitions

Some of the terms used in this description are defined below for easy reference. The presented terms and their respective definitions are not rigidly restricted to these definitions—a term may be further defined by the term's use within this disclosure. The term "exemplary" is used herein to mean serving as an example, instance, or illustration. Any aspect or design described herein as "exemplary" is not necessarily to be construed as preferred or advantageous over other aspects or designs. Rather, use of the word exemplary is intended to present concepts in a concrete fashion. As used in this application and the appended claims, the term "or" is intended to mean an inclusive "or" rather than an exclusive "or". That is, unless specified otherwise, or is clear from the context, "X employs A or B" is intended to mean any of the natural inclusive permutations. That is, if X employs A, X employs B, or X employs both A and B, then "X employs A or B" is satisfied under any of the foregoing instances. As used herein, at least one of A or B means at least one of A, or at least one of B, or at least one of both A and B. In other words, this phrase is disjunctive. The articles "a" and "an" as used in this application and the appended claims should generally be construed to mean "one or more" unless specified otherwise or is clear from the context to be directed to a singular form.

Reference is now made in detail to certain embodiments. The disclosed embodiments are not intended to be limiting of the claims.

Descriptions Of Example Embodiments

FIG. 1 depicts a light-emitting device structure 100 in accordance with designs of white-appearing LEDs using a temperature sensitive low-index particle layer. As an option, one or more variations of light-emitting device structure 100 or any aspect thereof may be implemented in any environment and/or in any context of the embodiments described herein.

The light-emitting device structure includes a semiconductor light-emitting device 120 that is formed by disposing a layer of p-type semiconductor material 106 atop a layer of n-type semiconductor material 104 to form an active region 105 in between. The active region may include doping materials (e.g., an epitaxially-grown active region layer). Light is generated when an electrical potential is applied between the p-type semiconductor material and the n-type semiconductor material. In many situations the generated light is substantially monochromatic (e.g., red, blue, violet). In some LED applications (e.g., illumination products) a more broad spectrum of light emissions (e.g., white light) is desired. As such, some LED designs dispose a wavelength-converting layer 118 in a path of light emitted by the semiconductor light-emitting device. The monochromatic light emitted from the active region of the LED is down-converted using any one or more of a range of known downconverting techniques (e.g., use of phosphors, quantum dots, etc.). One effect of use of such downconverting techniques (e.g., use of phosphors) is that the color of the wavelength-converting layer 118 can be detected by the naked eye. In some applications, the visibility of the peek-through color is highly undesirable. As such, designs such as the design corresponding to the light-emitting device structure 100 include a white color layer 102 so as to diminish or eliminate peek-through.

Various techniques, some of which are discussed herein, can be used to configure and form the white color layer. For example, the white color layer can be composited using light scattering and/or reflective particles in a binder such as a silicone to form a light-scattering layer, which in turn is disposed in the path of light emitted by the semiconductor light-emitting device 120. As discussed hereunder, the light-scattering layer might comprise scattering agents that are dispersed throughout a binding material. When incident light 116 strikes the light-scattering layer, some of the incident light is reflected back as white appearing light 114. In some cases, incident light passes through the light-scattering layer, is downconverted upon striking the materials of the wavelength layer, and then some of that downconverted light is reflected back to an observer, resulting in the colored peek-through light 115.

Both Heat and Light are Produced by the Semiconductor Light-Emitting Device

The aforementioned structures comprising the semiconductor light-emitting device 120 might be grown on a substrate 108 and, in turn, the substrate might be affixed to a thermal conductor 110 that serves to disperse at least some of the heat generated during operation of the LED. The thermal conductor might be opaque to light emanating from the LED, thus resulting in a substantial amount of light and heat emanating from the top of the semiconductor light-emitting device 120 during operation. Photons generated by operation of the LED passes through the wavelength converting layer. A portion of the photons, whether downconverted or not, do escape beyond the clear silicon dome 112 to produce light. However a portion of the photons generated by operation of the LED do not pass through the structures around the active region, and instead are captured in the matrix of the composition of the surrounding structures, resulting in heat rather than light. As heat is generated in the structures, the temperature rises, in spite of the presence of thermal conductor 110. As such, the temperature of the wavelength converting layer as well as the white color layer rises during operation of the LED. The temperature returns to an ambient temperature (e.g., room temperature) when the LED is in the off-state.

As earlier mentioned, one approach to reduce peek through is to make the diffusing layer thicker or denser. At some point the thickness or density of the diffusing layer produces enough scattering of incident light such that there is no visible peek through of the color of the body of the phosphors. As the thickness or density of the diffusing layer (e.g., the shown white color layer 102) increases, light-producing efficiency decreases. As such, there is a tradeoff between the light-producing efficiency of the semiconductor light-emitting device in the on-state and the thickness or density of the diffusing layer used to produce a white appearance in the off-state.

Figure 2:
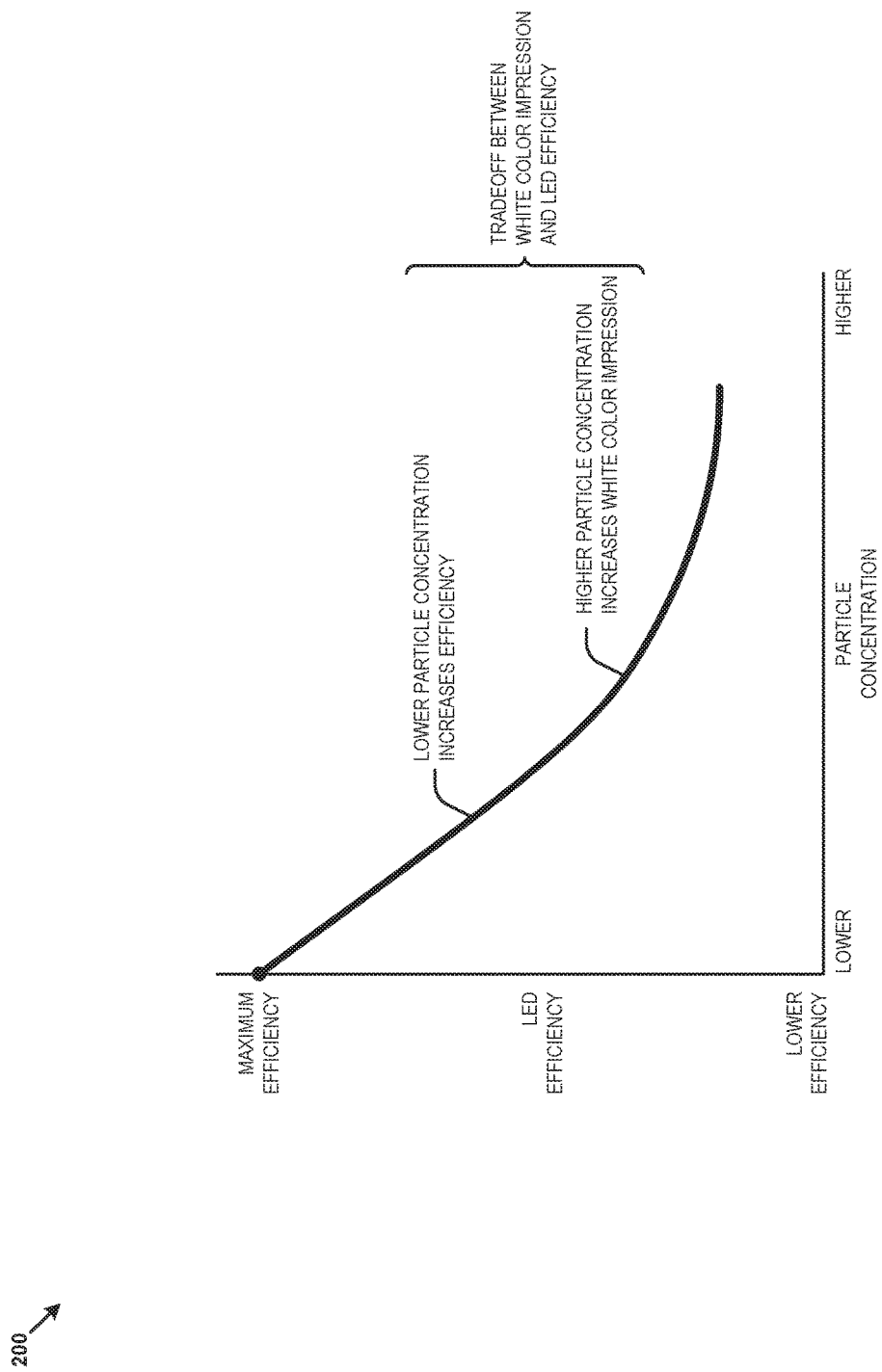
FIG. 2 is a particle concentration vs. efficiency plot showing decreases in light-emitting efficiency as particle concentration increases.

FIG. 2 is a particle concentration vs. efficiency plot 200 showing decreases in light-emitting efficiency as particle concentration increases. The shape of the curve is shown as depicting that as particle concentration increases, the LED efficiency decreases. Considering only the two interrelated variables, namely particle concentration and the resulting LED efficiency, there is a tradeoff between the light-producing efficiency of the semiconductor light-emitting device and the density or thickness of the diffusing layer used to produce a white appearance in the off-state. Fortunately, varying the particle densities or thicknesses of the diffusing layer is just one of many technique to facilitate a white-appearance of an LED device. Other techniques that can be used to tune a white appearance of an LED device include increasing scattering of incident light through mismatching the index of refraction of two constituent materials, and increasing reflectivity through increased particle loading, some of which effects are presented respectively in the following FIG. 3A and FIG. 3B.

Figure 3A:
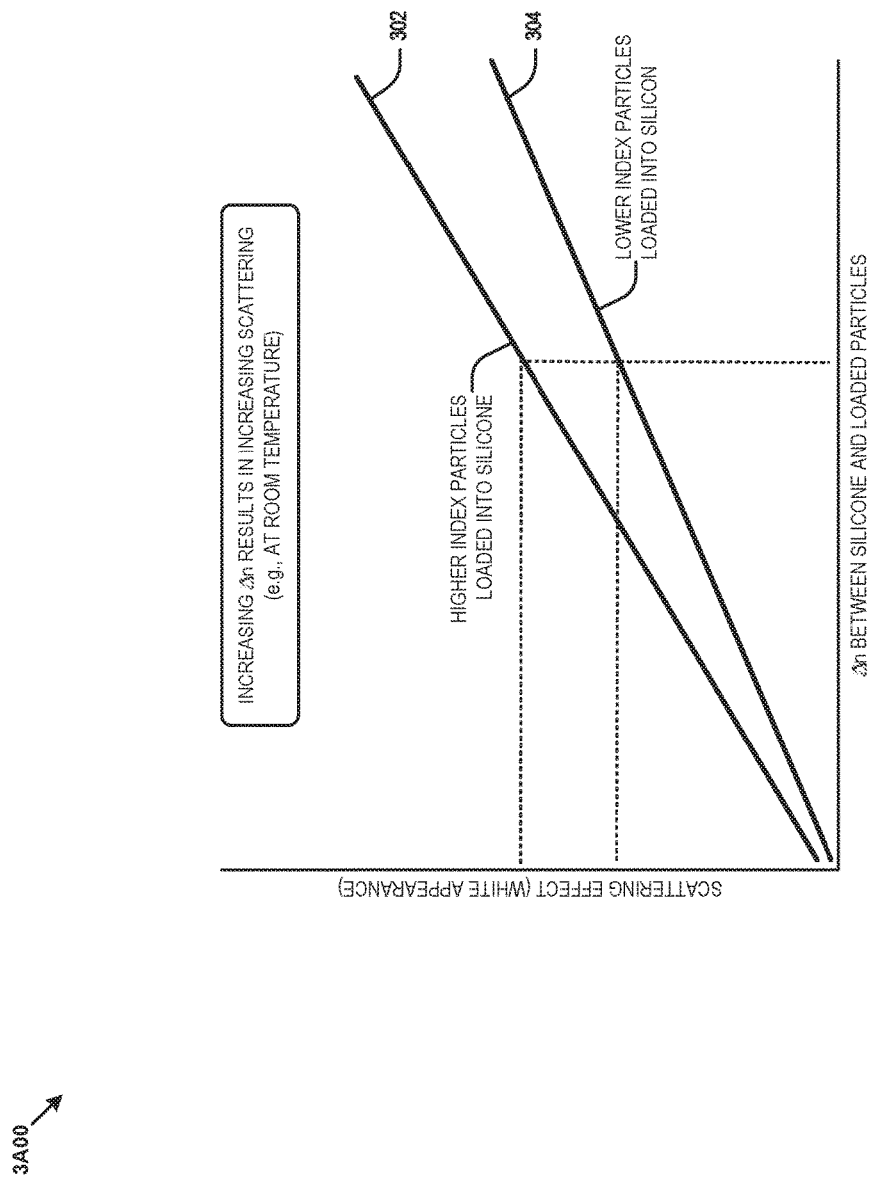
FIG. 3A is a white appearance tuning chart showing increased scattering as a function of an index of refraction mismatch, according to an embodiment.

FIG. 3A is a white appearance tuning chart 3A00 showing increased scattering as a function of an index of refraction mismatch. As an option, one or more variations of white appearance tuning chart 3A00 or any aspect thereof may be implemented in any environment and/or in any context of the embodiments described herein.

The embodiment shown in FIG. 3A is merely one example to illustrate the influence on scattering effects when mixing two constituent materials having different indexes of refraction. As given in the case depicted by curve 302, a high index material (e.g., in the form of particles) is loaded into a silicone carrier. As given in another case as depicted by curve 304, a low index material (e.g., in the form of particles) is loaded into a silicone carrier. Other variables being held equal, a higher index particle loaded into a silicone will result in a higher scattering effect as compared to a lower index particle loaded into the same silicone. In addition to increasing scattering to achieve a white appearance, reflectivity can be tuned so as to facilitate achievement of a white appearance. As is discussed further hereunder, naive observation of this phenomenon leads to designer selection of higher index particles loaded into a silicone when forming a white color layer.

Figure 3B:
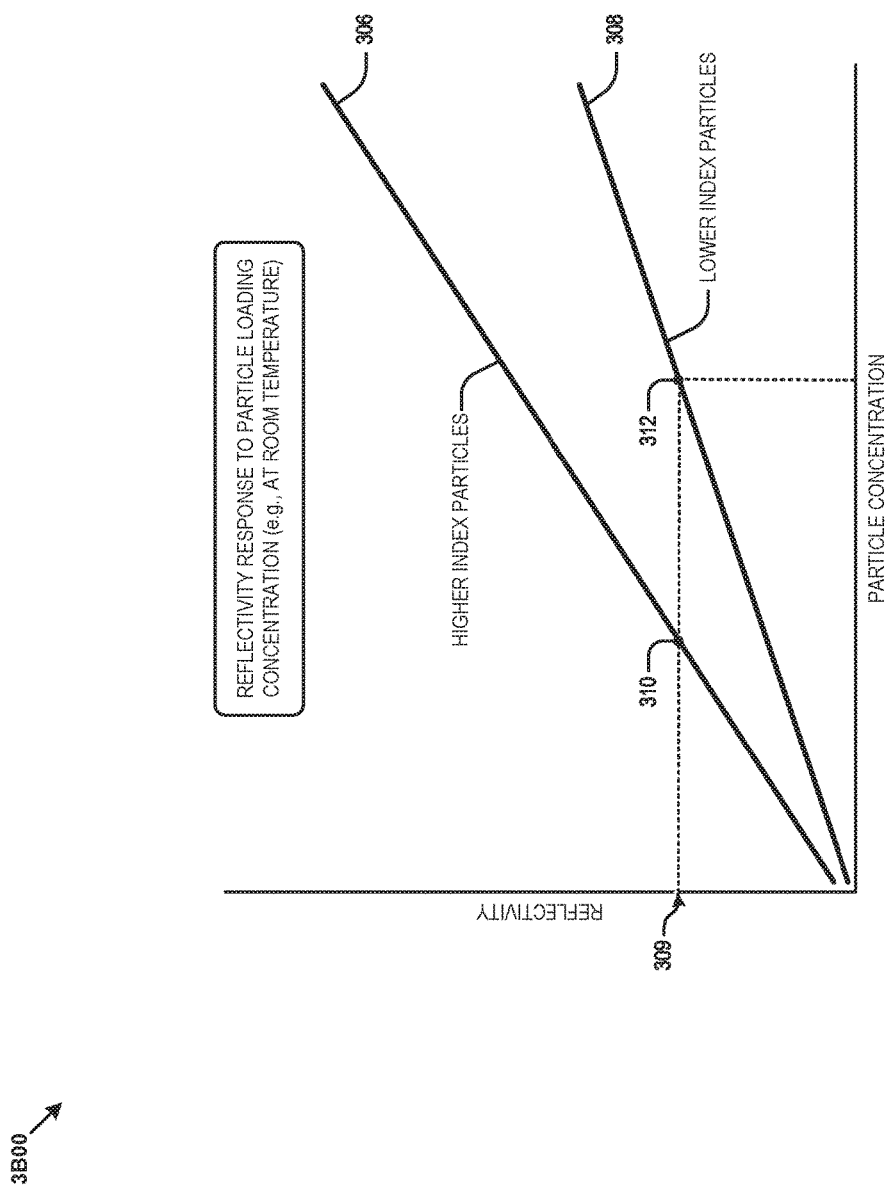
FIG. 3B is a white appearance tuning chart showing reflectivity as a function of particle concentration, according to an embodiment.

FIG. 3B is a white appearance tuning chart 3B00 showing reflectivity as a function of particle concentration. As shown, for a particular desired reflectivity, a lower particle concentration (e.g., potentially leading to more efficient light production) can be selected using a higher index particle as compared to selection of a lower index particle. More specifically, for a particular desired reflectivity 309, a lower particle concentration can be selected along curve 306 at intersection 310 using a higher index particle as compared to selection at intersection 312 along curve 308 that pertains to use of a lower index particle to achieve the same reflectivity.

As is discussed further hereunder, naive observation of this phenomenon leads to designer selection of higher index particles loaded into a silicone when forming a white color layer.

Figure 4:
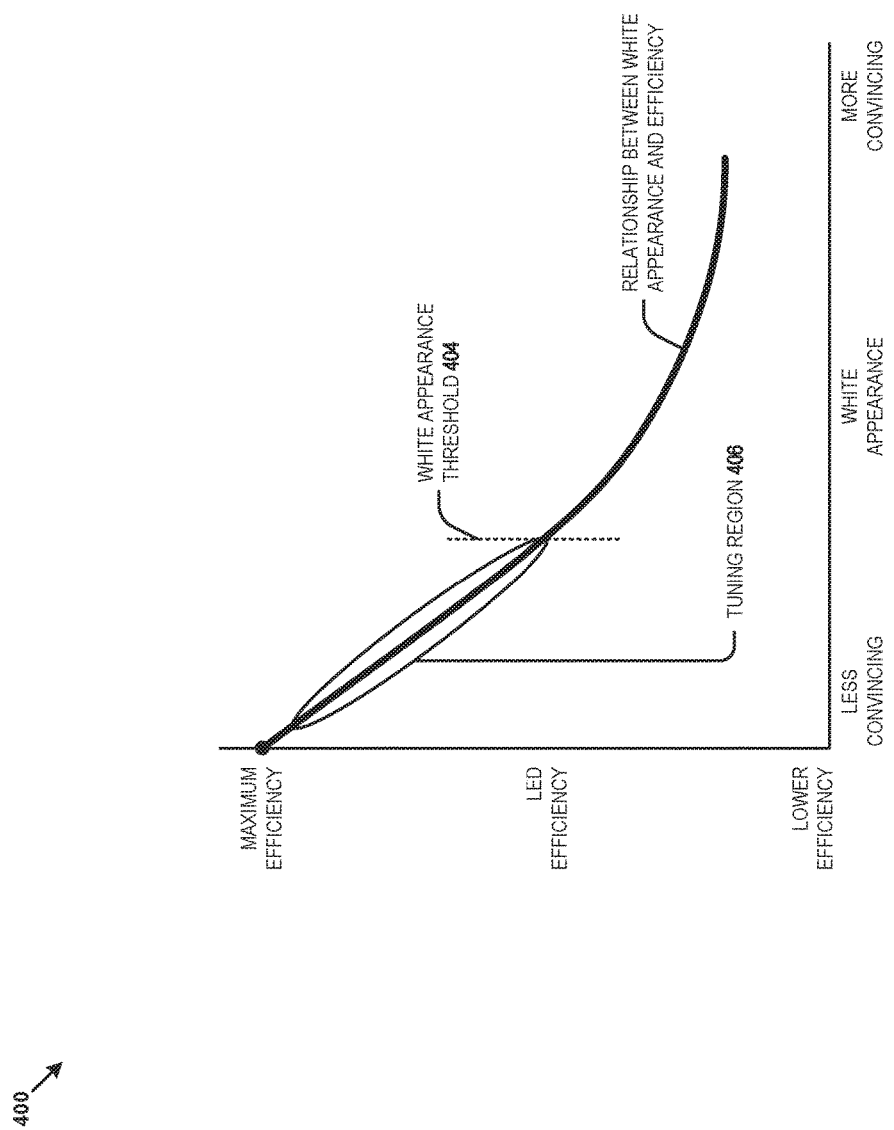
FIG. 4 is an efficiency tradeoff tuning chart showing decreasing efficiency as a function of a white appearance, according to an embodiment.

FIG. 4 is an efficiency tradeoff tuning chart 400 showing decreasing efficiency as a function of a white appearance. Using any or all of the foregoing techniques to achieve a white appearance of an LED device, a designer might construct a tradeoff tuning chart 400 so as to facilitate an understanding of tradeoffs being made between white appearance and efficiency. In the example shown, high index particles are loaded into a silicone to a concentration sufficient to produce a convincing white appearance (see white appearance threshold 404). The concentration is then lowered until tuned to an acceptable loss of efficiency, which tuning may depend on the intended LED application. The tuning region 406 can vary over several interrelated variables such as selection of materials, relative portions and/or concentrations of the selected materials, temperature ranges, etc.

Strictly as an example, some off-state white appearing LEDs (e.g., for photo flash applications) are based on TiO2 particles in a silicone matrix. The refractive index difference in combination with the particle size distribution leads to efficient scattering, at least so as to achieve the aforementioned white appearance (see white appearance threshold 404). As measured, the penalty in light output in such a configuration is about 10% (e.g., 10% loss of efficiency), however while in the off-state the phosphor color is not completely hidden.

Any or all of the many aforementioned naive selections of high index particles such as selections of high index particles to achieve larger differences in the index of refraction (e.g., to improve scattering), and/or selections of high index particles so as to rely on only low concentrations of particles (e.g., to improve efficiency) fail to observe and/or account for (1) variations in differences in index of refraction over a temperature range, and (2) variations in loading density (e.g., concentration) of particles over a temperature range.

Changes in Material Behavior Over a Temperature Range

If instead of the use of high refractive index particles (e.g., TiO2 particles), lower index of refraction particles are used (e.g., lower than that of the silicone in which they are embedded) and, as such, one can make use of the change in refractive index of the silicone with temperature to tune the scattering. Use of lower index of refraction particles in the silicone and tuning therefrom leads to a tradeoff between a more convincing white color impression in the off-state and/or a reduction of light loss in the on-state, yet at operating temperatures, the lower index of refraction particles and the silicone are substantially index-matched, leading to near transparency, and thus leading to nearly no loss of efficiency. In addition to the counterintuitive selection of lower index materials in this application, it is also possible to use phase changing materials (e.g., beads) embedded in the silicone. Using such beads, one can avail use of the solid-liquid phase transition that occurs at a temperature between ambient temperatures and operating temperatures. When passing through the solid-liquid phase transition, the beads undergo variations in their index of refraction, thus changing from exhibiting relatively high scattering (e.g., at temperatures below the melting point of the phase change material) to a nearly transparent state (e.g., at temperatures above the melting point of the phase change material).

The above observations regarding the changes in the index of refraction of silicones over a temperature range and regarding the changes in the index of refraction of phase changing beads over a temperature range can be plotted on a material selection chart.

FIG. 5 is a material selection chart 500 showing a selection of materials exhibiting transparency over an operating temperature range. As an option, one or more variations of material selection chart 500 or any aspect thereof may be implemented in any environment and/or in any context of the embodiments described herein.

The embodiment shown in FIG. 5 is merely one example. As shown, the refractive index of silicones varies strongly with temperature (e.g., see the silicone response 502). The relatively large change in the silicone's index of refraction over a temperature range is closely related to its high expansion coefficient over that same temperature range. When the LED is in an operating mode (e.g., in an on-state), the temperature of the white color layer 102 that is disposed on top of the phosphor will increase. As mentioned above, the refractive index of the silicone matrix decreases strongly with temperature (which effect is shown as silicone response 502), while the refractive index of embedded particles will hardly change at all as a function of temperature (which effect is shown as low index particle response 504). Thus, when a silicone with silicone response 502 is selected and loaded with particles exhibiting a low index particle response 504, the index of refraction will become matched over an operating temperature range 510, leading to increased light output, at least during the time that the operating temperatures are at or near the transparent range 508.

Conversely, and as shown, a combination of a high index particle with a silicone has a large and increasing difference in its index of refraction as temperatures increase from low room temperatures to high operating temperatures. The trend toward higher and higher differences in index of refraction leads to higher and higher scattering from the combination of a high index particle in a silicone, which in turn leads to lower LED efficiency. This trend is shown by the widening gap between the high index particle response 506 and the silicone response 502.

The material selection chart 500 can be used in the design of semiconductor light-emitting devices. Specifically, given a colored (e.g., red, yellow, or orange) wavelength-converting layer that is disposed in a path of light emitted by the semiconductor light-emitting device, then a light-scattering layer such as the white color layer 102 can be designed in accordance with the material selection chart 500, i.e., the white color layer can be disposed in the path of light emitted by the semiconductor light-emitting device. Incident light from the ambient environment is reflected off the light scattering layer, yielding the desired convincingly white off-state appearance.

Referring to the curve labeled as silicone response 502, the light-scattering layer is designed such that a binding material (e.g., silicone) is selected to have a relatively low index of refraction at room temperatures and an even lower index of refraction at operating temperatures. Further, the shown scattering agents depicted by the low index particle response curve has a low index of refraction at the same room temperatures and an even lower index of refraction at operating temperatures. Such a structure with the selected constituents is white appearing in an ambient temperature range of about 0° C. to about 45° C. Moreover, such a structure with the selected constituents is substantially transparent when operating in a temperature range of about 100° C. to about 250° C. In certain designs, phase-changing materials are disposed in a tuned concentration within a binding material (e.g., silicone) such that the phase-changing materials and respective concentration within the binding materials are selected so as to have a relatively low index of refraction at room temperatures and an even lower index of refraction at operating temperatures.

Selection and tuning techniques for low index particles in silicone as well as selection and tuning techniques for phase changing materials in silicone are presented hereunder.

FIG. 6A is a flowchart showing a low-index particle selection technique 6A00 for designing white-appearing LEDs using a temperature sensitive low-index particle layer. As an option, one or more variations of low-index particle selection technique 6A00 or any aspect thereof may be implemented in any environment and/or in any context of the embodiments described herein.

The embodiment shown in FIG. 6A is merely one example to illustrate a low index particle tuning loop 622. The flow commences upon receiving some requirements (e.g., LED application requirements), which requirements include ambient temperature ranges as well as operating temperatures. The operating temperatures may be derived from temperature measurements taken at or near an active region of an LED. From the given temperatures, a temperature variation between the ambient temperature and the operating temperature is calculated (step 608). A silicone with a high gradient of change of its index of refraction is selected (step 610), possibly using datasheets and/or a silicone database 618 or any combination thereof (for example, https://refractiveindex.info/ or vendor data such as from Shin-Etsu Chemical or Dow Corning). Next, as shown, a low index particle is selected (step 612), also possibly using datasheets and/or a particle database 620 or any combination thereof. Using empirical data from tests, or from provided specification data, a determination is made (decision 614) whether or not the index of refraction is a sufficient match at operating temperatures. If so, the "YES" branch of decision 614 is taken and a determination is made (decision 616) as to whether or not the scattering is sufficient at room temperatures so as to impart the desired degree of white color. If so, the "YES" branch of decision 616 is taken and the show selection technique 6A00 ends.

If the "NO" branch of decision 614 or the "NO" branch of decision 616 is taken, then tuning can be approached by reselecting a different particle (see "YES" branch of decision 606) and/or by reselecting a different silicone (see "YES" branch of decision 604), or both. In some cases, the "NO" branch of decision 604 might be taken, which might then cause the designer to relax the given requirements (step 602) and enter the low index particle tuning loop again.

Many suitable low index particles can be found in many available databases. Strictly as examples, suitable low refractive index inorganic materials such as magnesium fluoride (n=1.37) and porous silica particles can be used. Such inorganic materials are not strongly susceptible to becoming optically absorbing over time at high light exposure or during manufacturing processes such as solder reflow steps, and thus make good exemplars.

Many suitable silicones can be found in many available databases. The refractive index of silicones changes along a gradient of $3.5\text{-}4*10^{-4}$ $K^{-1}$, while the refractive index of many inorganic materials such as SiO2 only changes along a gradient of $0.12*10^{-4}$ $K^{-1}$.

NUMERIC EXAMPLE 1

Phosphor temperatures can increase from room temperature to 120° C. or more and therefore the refractive index of the silicone can be expected to decrease 0.04 during operation. Therefore if the refractive index of the particles is chosen to be 0.04 lower than that of the silicone matrix, a 100° C. increase would lead to a matching of the refractive indices and therefore lead to transparency of the layer. The reduced scattering in the off-state compared to high refractive index fillers can be compensated by choosing combinations of materials that exhibit a relatively larger difference in their index of refraction in the off-state (e.g., by using particles exhibiting a steeper gradient), and/or by choosing a higher volume fraction of particles loaded into the carrier.

Figure 6B:
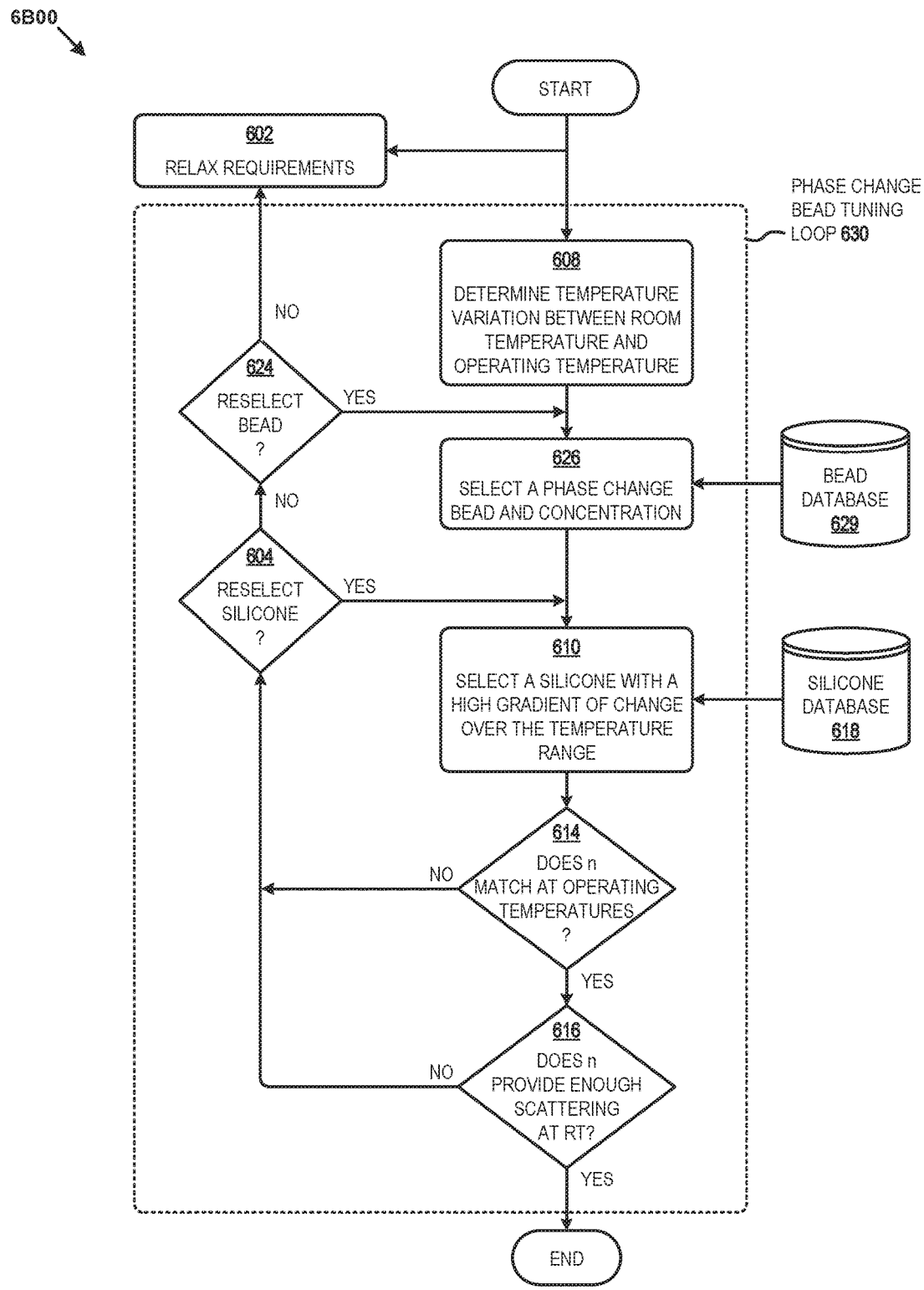
FIG. 6B is a flowchart showing a phase changing material selection technique for designing white-appearing LEDs using a temperature sensitive low-index particle layer, according to an embodiment.

FIG. 6B is a flowchart showing a phase changing material selection technique 6B00 for designing white-appearing LEDs using a temperature sensitive low-index particle layer. As an option, one or more variations of phase changing material selection technique 6B00 or any aspect thereof may be implemented in any environment and/or in any context of the embodiments described herein.

The embodiment shown in FIG. 6B is merely one example to illustrate a phase change bead tuning loop 630. The flow commences upon receiving some requirements (e.g., LED application requirements), which requirements include ambient temperature ranges as well as operating temperatures. The operating temperatures may be derived from temperature measurements taken at or near an active region of an LED. From the given temperatures, a temperature variation between the ambient temperature and the operating temperature is calculated (step 608). A phase change bead is selected (step 626), possibly using datasheets and/or a bead database 629 or any combination thereof. The selection might include a target concentration. Next, a silicone with a high gradient of change of its index of refraction is selected (step 610), possibly using datasheets and/or a silicone database 618 or any combination thereof.

Using empirical data from tests, or from provided specification data, a determination is made (decision 614) whether or not the index of refraction is a sufficient match at operating temperatures. If so, the "YES" branch of decision 614 is taken and a determination is made (decision 616) as to whether or not the scattering is sufficient at room temperatures so as to impart the desired degree of white color appearance.

If the "NO" branch of decision 614 or the "NO" branch of decision 616 is taken, then tuning can be approached by reselecting a different silicone (decision 604), and/or reselecting a different bead (decision 624), or both. In some cases, the "NO" branch of decision 624 might be taken, which might then cause the designer to relax the given requirements (step 602) and enter the low index particle tuning loop again.

NUMERIC EXAMPLE 2

Phase change materials often contain a wax encapsulated by a polymer shell to form a bead. In its solid state of matter, the wax exhibits a crystalline structure and therefore exhibits scattering. However, while in its liquid phase, the wax is transparent. Paraffin waxes have a refractive index in the liquid state of 1.47-1.48. To achieve index matching with a silicone matrix into which the beads are embedded, a silicone has to be chosen in this range (at step 626). The capsule shell can consist of a polymer, and often melamine compounds are used, which compounds have good high temperature stability characteristics. Other polymers like silicones or inorganic materials like silica could be applicable.

To illustrate the principle with an example, a phase change material, known as "MCPM43D" (Microtek Laboratories, Inc.) that has a melting point of 43° C., was embedded in a high index silicone and drop-cast on glass slides. After curing, the change in scattering was observed over a wide temperature range (e.g., by mounting the sample on a heating stage). The sample was exposed to laser light (at about 450 nm) and the transmitted light was detected using an integrating sphere placed 3 cm behind the sample with an opening diameter of 1 cm. As measured, the transmitted light increases significantly after the temperature exceeds the melting temperature of the phase change material. As measured, the transmitted light continues to increase with further temperature increases due at least to decreases in the silicone refractive index as the matrix of the high index silicone expands.

Either the low index particle tuning loop 622 or the phase change bead tuning loop 630 or both can be used as material selection techniques for a wide variety of LED applications, possibly involving nominal operating temperatures that span a wide range (e.g., 100° C. to >250° C.).

Figure 7:
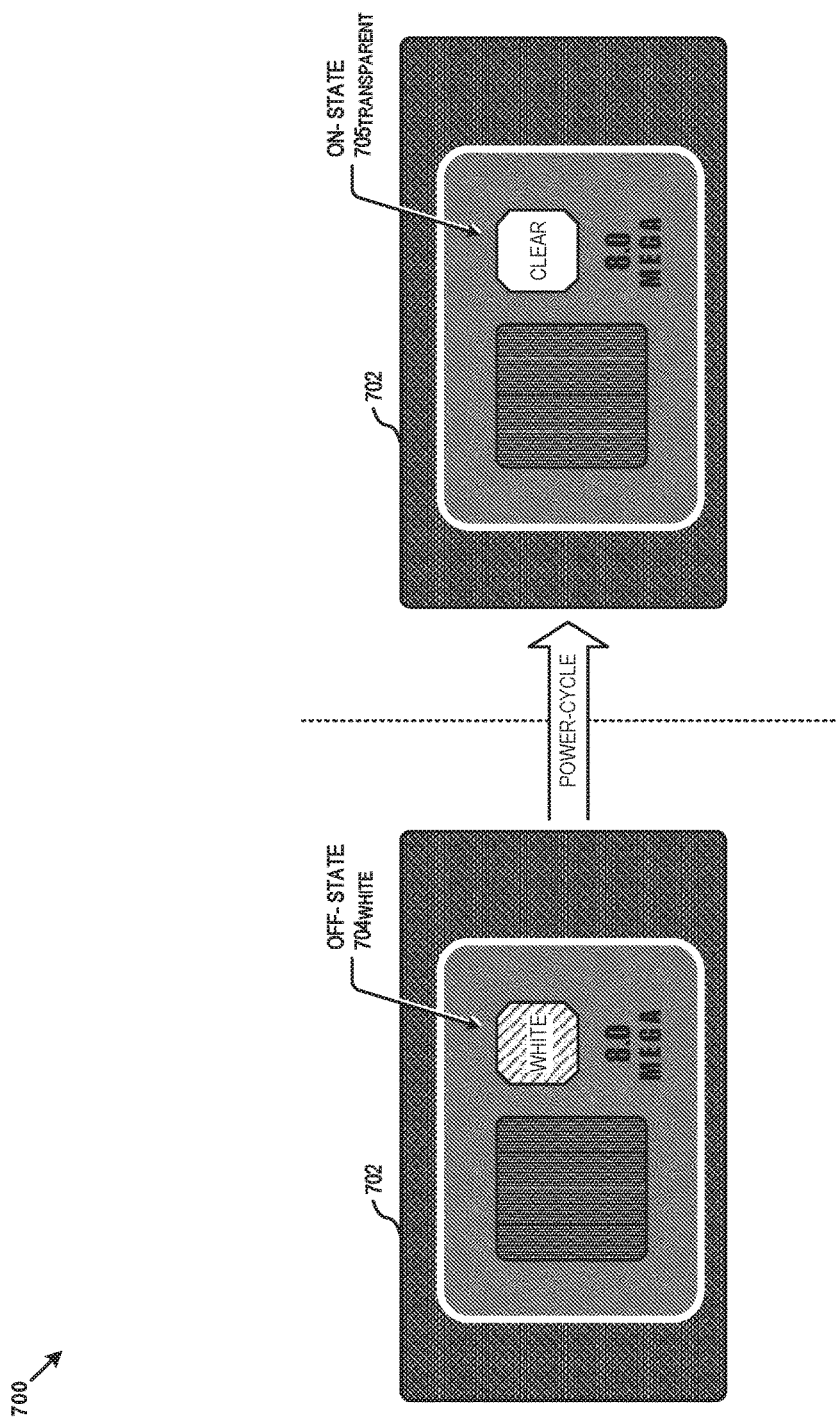
FIG. 7 is a transition chart depicting use of an LED in a camera photo flash application having a power-cycle transition from a white-appearing LED to a transparent LED by using a temperature sensitive low-index particle layer, according to an embodiment.

FIG. 7 is a transition chart 700 depicting use of an LED in a camera photo flash application having a power-cycle transition from a white-appearing LED to a transparent LED by using a temperature sensitive low-index particle layer.

As shown, the camera 702 hosts a flash unit which in turn hosts a white appearing LED apparatus in a room temperature off-state $704_{WHITE}$ mode. In operation (e.g., during a flash cycle), the camera delivers power to the flash unit which then power-cycles the flash unit into an on-state $705_{TRANSPARENT}$ mode.

As an option, one or more variations of camera photo flash application or any aspect thereof may be implemented in any environment and/or in any context of the embodiments described herein. The off-state white feature is an aesthetic feature used for a photo flash unit. Such an off-state white layer that exhibits on-state transparency can be formed and disposed near the colored phosphors as is depicted in FIG. 1. The white color layer 102 hides the phosphor colors when the LED is switched off. Such a design has additional potential applicability for use in other LED applications, such as for automotive headlights, other automotive lighting, and many varieties of filament lamps or any illumination product where, in absence of the white color layer, the undesired coloring of the phosphor depositions can be seen with the naked eye. An LED for a camera photo flash application and/or for other LED applications can be constructed using any known apparatus construction techniques, some of which are shown and discussed in the following figures.

Figure 8A:
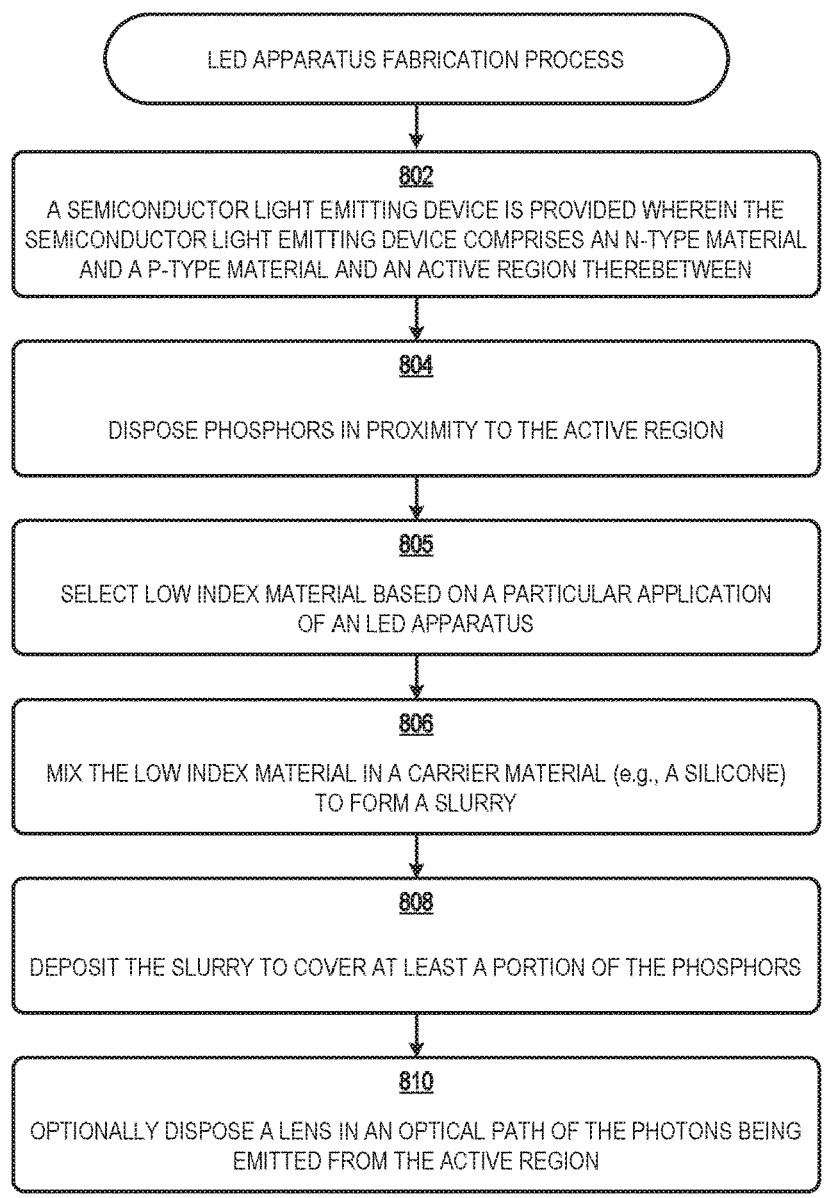
FIG. 8A is a flowchart showing an LED apparatus construction technique when using white-appearing LEDs having a temperature sensitive low-index particle layer, according to some embodiments.

FIG. 8A is a flowchart showing an LED apparatus construction technique 8A00 when using white-appearing LEDs having a temperature sensitive low-index particle layer. As an option, one or more variations of LED apparatus construction technique 8A00 or any aspect thereof may be implemented in any environment and/or in any context of the embodiments described herein.

As shown, a semiconductor light emitting device is provided (step 802). Wavelength-converting materials (phosphors, dyes, quantum dots, etc.) are disposed proximal to the active region of the semiconductor light emitting device (step 804). Based on a particular use or application for the semiconductor light emitting device, and/or based on the intended use of the semiconductor light emitting device, one or more low-index particles or beads are selected, possibly in accordance with the foregoing flows of FIG. 6A and FIG. 6B (step 805). The selected one or more low-index particles or beads are mixed with a carrier material (step 806) to form a slurry that is then deposited over the wavelength converting materials (step 808). After curing or other hardening of the slurry, the deposits of step 808 form a scattering layer such as the white color layer 102 of light-emitting device structure 100. In some embodiments, a lens such as the clear silicone dome 112 of light-emitting device structure 100 is placed in an optical path of photons emanating from the active region (step 810).

Figure 8B:
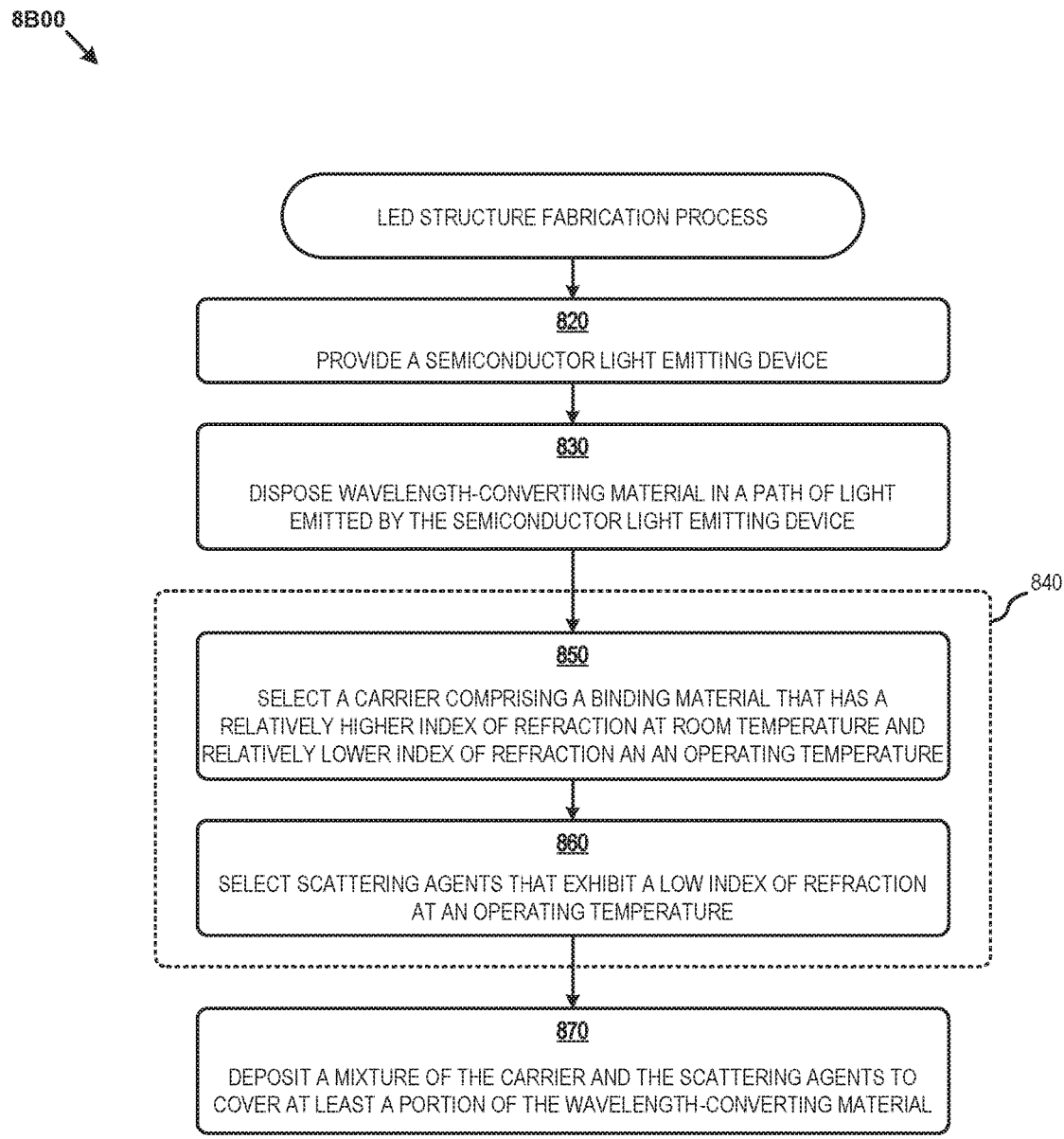
FIG. 8B is a flowchart showing a semiconductor light-emitting device construction technique when using white-appearing LEDs having a temperature sensitive low-index particle layer, according to some embodiments.

FIG. 8B is a flowchart showing a semiconductor light-emitting device construction technique 8B00 when using white-appearing LEDs having a temperature sensitive low-index particle layer. As an option, one or more variations of semiconductor light-emitting device construction technique 8B00 or any aspect thereof may be implemented in any environment and/or in any context of the embodiments described herein.

The shown flow commences at step 820 to provide a semiconductor light emitting device. In many cases, white light, or at least polychromatic light, is desired for the LED application. As such, step 830 serves to deposit wavelength converting material in a path of light emitted by the semiconductor light emitting device. In many cases, an off-state white appearance is desired for the LED application. As such, performance of the steps that comprise group 840 serve to provide a scattering layer that can be disposed over the aforementioned deposits of wavelength converting materials. More specifically, the selection of a carrier (step 850) and the selection of scattering agents (step 860) can be performed in parallel or in tandem such that a scattering layer formed of the materials selected in group 840 can cover (e.g., at least partially) the deposited wavelength converting materials (step 870).

Figure 9A:
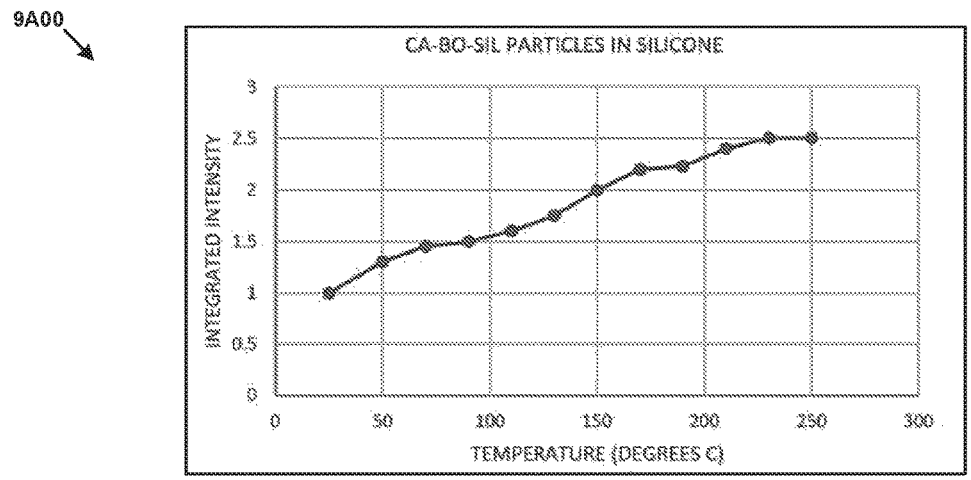
FIG. 9A depicts performance measurements of a semiconductor light-emitting device having a white-appearing layer formed by fumed silica particles in a silicone mixture, according to an embodiment.

FIG. 9A depicts performance measurements 9A00 of a semiconductor light-emitting device having a white-appearing layer formed by fumed silica (e.g., Cab-O-Sil® M5, Cabot Corporation) particles in a silicone mixture. As an option, one or more variations of performance measurements 9A00 or any aspect thereof may be implemented in any environment and/or in any context of the embodiments described herein.

During the empirical setup used to collect the performance measurements, example white color layers were prepared using several materials, including silica particles. Such silica particles are commercially available as spherical silica in micron-sized particles and having high internal porosity. The material was embedded in a high index silicone (e.g., OE-7662, Dow Corning). Layers were deposited on glass slides and cured for 2 hours at 150° C. The change in scattering over a temperature range was tested on a setup where the sample was mounted on a heating stage. The sample was exposed to laser light (450 nm) and the transmitted light was detected using an integrating sphere placed 3 cm behind the sample with an opening diameter of 1 cm. The data recorded as a function of temperature are given in FIG. 9A. For Cab-O-Sil®, an increase in transmission with a factor of about 2.5 between room temperature and 250° C. is found. Moreover, every incremental temperature increase or temperature decrease is matched by a directly correlated change in the transmitted intensity (as shown), thus demonstrating the principle of operation of the herein-disclosed techniques.

The principle of operation that is demonstrated in the foregoing FIG. 9A can also be demonstrated when using phase-changing beads.

Figure 9B:
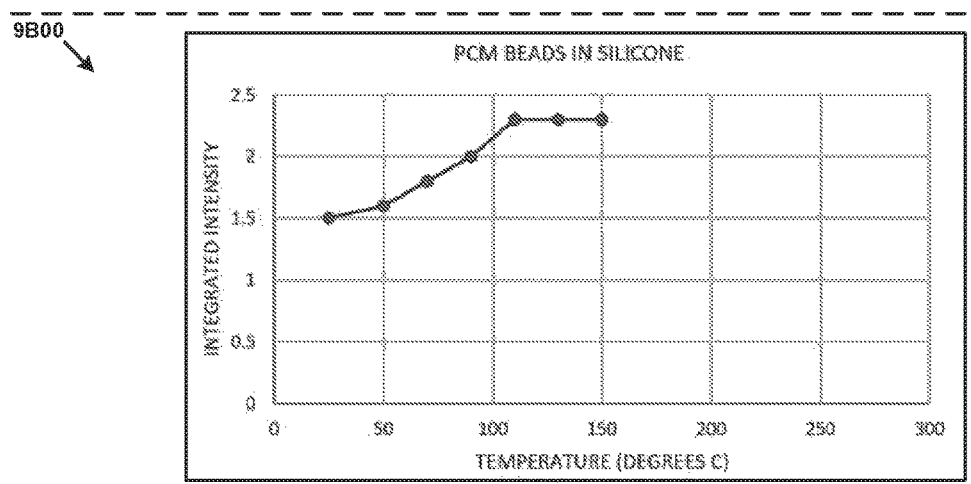
FIG. 9B depicts performance measurements of a semiconductor light-emitting device having a white-appearing layer formed by phase changing beads in a silicone mixture, according to an embodiment.

FIG. 9B depicts performance measurements 9B00 of a semiconductor light-emitting device having a white-appearing layer formed by phase changing beads in a silicone mixture. As an option, one or more variations of performance measurements 9B00 or any aspect thereof may be implemented in any environment and/or in any context of the embodiments described herein.

The curve of FIG. 9B shows the change in transmitted blue light measured at different temperatures. As shown, the light transmission measured as integrated intensity increases as a function of increasing temperatures, at least through the range of about 50° C. to about 110° C. More particularly, between room temperature and about 50° C., a pronounced increase of integrated intensity occurs, which increase can be attributed to the phase change. At even higher temperatures (e.g., higher than about 110° C.), the light transmission increases still further, primarily due to the decrease of the refractive index of the silicone carrier as a function of matrix expansion under increasing temperature. The processes are reversible, and the sample apparatus is high temperature-resistant. Specifically, even after heating up to 250° C., the sample returns to a previously measured scattering level after cooling back to room temperature.

The aforementioned silica particles and the aforementioned phase changing beads are merely examples. Certain other materials perform with larger responses to temperature changes, and certain other materials are relatively more or relatively less effective in one LED application or another.

Figure 9C:
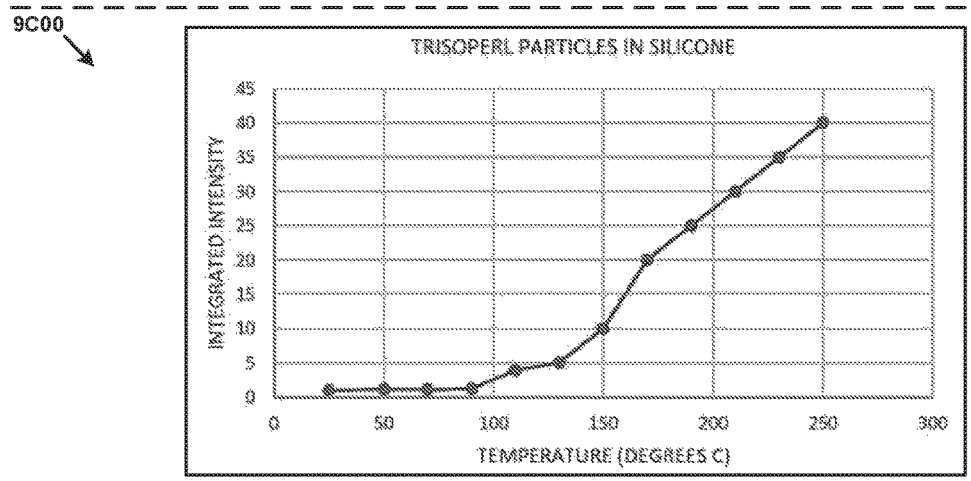
FIG. 9C depicts performance measurements of a semiconductor light-emitting device having a white-appearing layer formed by porous silica beads in a silicone mixture, according to an embodiment.

FIG. 9C depicts performance measurements 9C00 of a semiconductor light-emitting device having a white-appearing layer formed by Trisoperl®, Sigma-Aldrich particles in a silicone mixture. As an option, one or more variations of performance measurements 9C00 or any aspect thereof may be implemented in any environment and/or in any context of the embodiments described herein.

The off-state of this sample white-appearing layer is convincingly white. As measured by integrated intensity, the transmission increases 30 fold upon heating from room temperature to 250° C. For other LED applications, particularly LED applications where operating temperatures are lower than 250° C., the heretofore disclosed techniques facilitate tuning of the refractive index of the silicone to a lower value (e.g., to optimize transmission at other operational temperatures).

Strictly as additional examples, combinations of silicones and scattering particles can be selected from datasheets or from databases or from selection tables, an example of which selection table is presented in the following Table 1.

TABLE 1

Sample combinations

| Silicone Identification | Silicone Index of Refraction | Scattering Particle Identification | Particle Index of Refraction |
|---|---|---|---|
| OE7662 (phenyl-based silicone, Dow Corning) | 1.55 | TiO2 particles (e.g., DuPont ™ Ti-pure ® R101) | ~2.4 |
| OE6370 (PDMS-based silicone, Dow Corning) | 1.42 | SiO2 particles (e.g., Davisil ® silica gel) | ~1.3 |

Additional Embodiments of the Disclosure

Additional Practical Application Examples

Figure 10A:
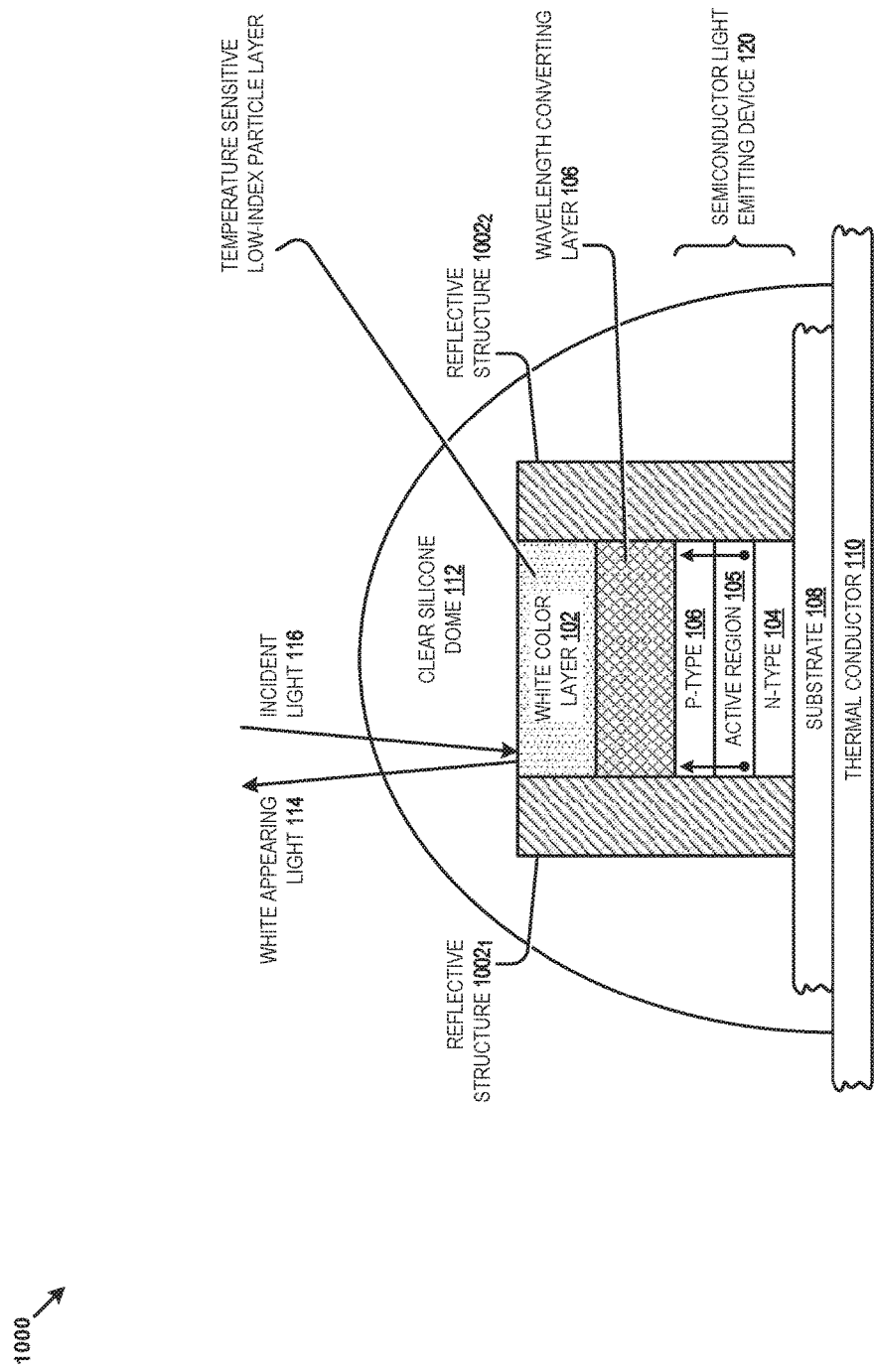
FIG. 10A and FIG. 10B depict light-emitting device structures in accordance with designs of white-appearing LEDs using a temperature sensitive low-index particle layer, according to some embodiments.

FIG. 10A depicts a light-emitting device structure 1000 in accordance with designs of white-appearing LEDs using a temperature sensitive low-index particle layer. In this embodiment, the white color layer covers only the top portion of the wavelength converting layer. The sides of the wavelength converting layer abut against reflective structures (e.g., first reflective structure 10021 and second reflective structure 10022). This embodiment is merely one additional embodiment involving a white color layer disposed in proximity to wavelength converting materials so as to attenuate or eliminate peek-through colors from the wavelength converting materials. Strictly as one such example, wavelength converting materials might be deposited to the sides of the active region. The white color layer can be formed into any shape, and/or can fill any cavity, and/or can be integrated with any other LED structure, possibly including integration by gluing or otherwise physically affixing the hardened white layer to a wavelength converting tile.

Figure 10B:
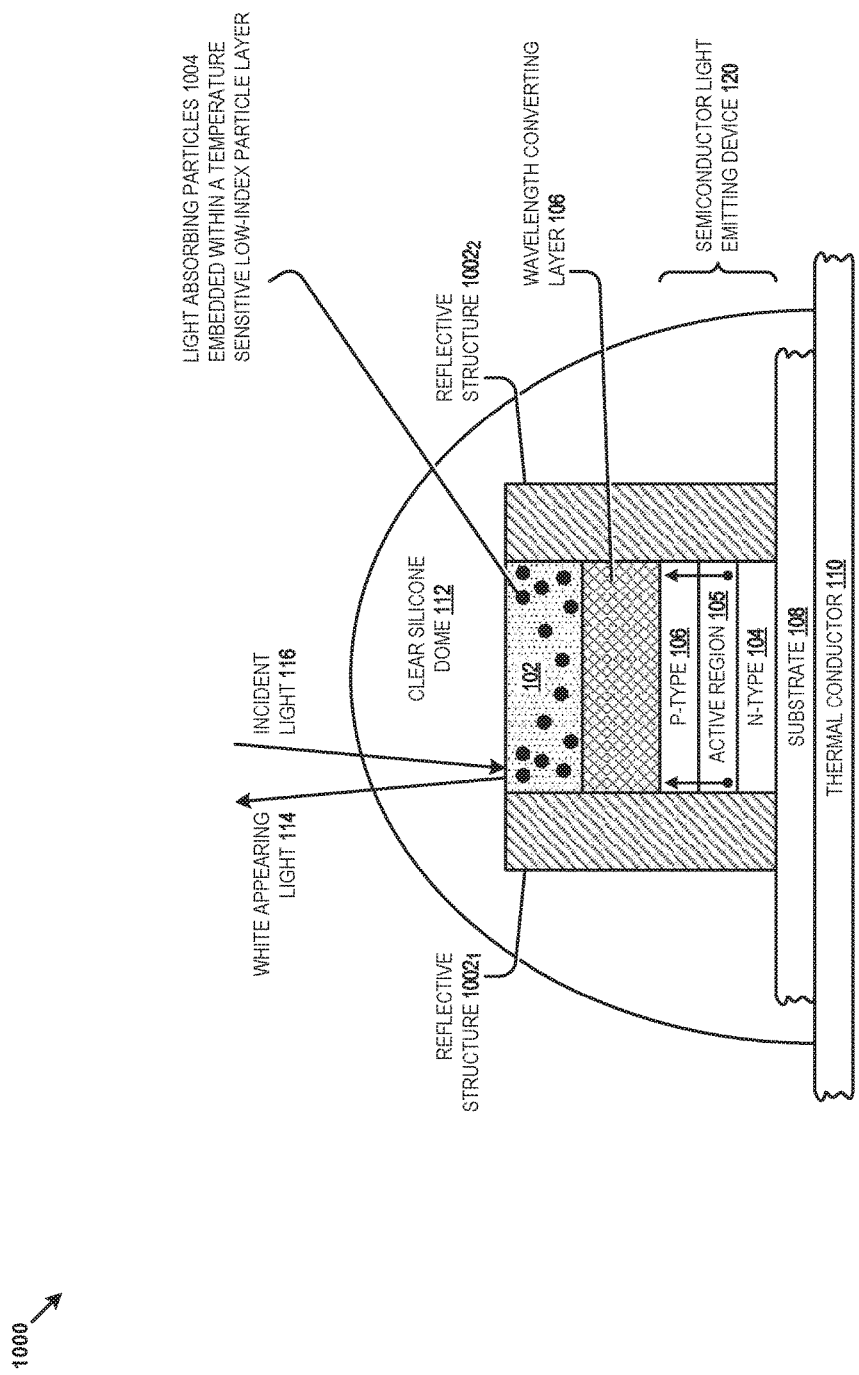

FIG. 10B depicts a variation of light-emitting device structure 1000. This embodiment includes a small concentration of a black light absorbing particles 1004, which particles serve to heat up the temperature sensitive low-index particle layer during the on-state. Heat generated by photons that are converted to heat in the phosphor layer serve to conduct heat into a scattering layer such as a temperature sensitive low-index particle layer. The rate of heating of the temperature sensitive low-index particle layer can be improved by including light absorbing particles 1004 in the temperature sensitive low-index particle layer, as shown. Certain applications operate in the on-state (e.g., at higher temperatures) over relatively short time periods, thus the temperature sensitive low-index particle layer needs to convert to its transparent state relatively quickly. As a specific example, photo flash applications have a light pulse duration of only about 200 ms, during which light pulse time, the white color layer 102 heats up to temperatures that transition the temperature sensitive low-index particle layer to its transparent on-state.

Additional Systems Employing Embodiments of the Disclosure

Additional Examples

Figure 11A:
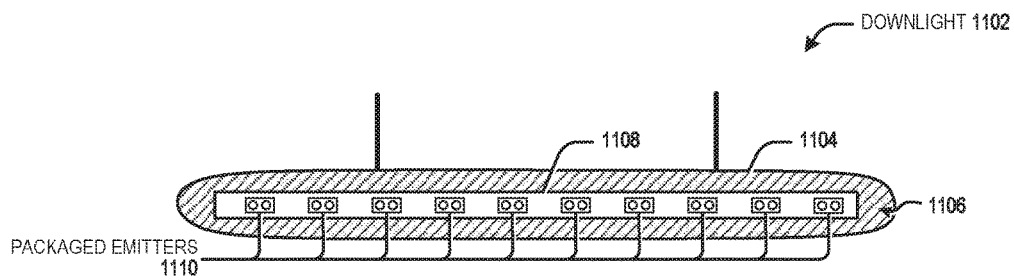
FIG. 11A, FIG. 11B and FIG. 11C depict luminaires suitable for use in various configurations of the embodiments of the present disclosure and/or for use in the herein-described environments.

FIG. 11A presents a side view of a downlight installation. As shown, the downlight installation 1102 includes a rigid or semi-rigid housing 1104 that supports a light-emitting device array 1106. The array of light-emitting devices can be organized into any arrangement, for example and as shown, into a linear array that is disposed in within the boundary of a printed wiring board module 1108. Some downlights might be composed of more (or fewer) instances of downlight emitters 1110 in the light-emitting device array.

Figure 11B:
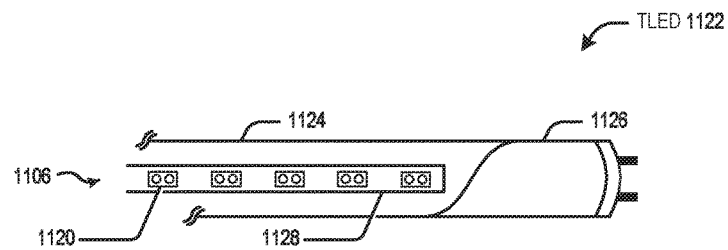

FIG. 11B presents a side view of a tube light-emitting diode (TLED) installation.

As shown, a TLED 1122 includes a linear array of instances of TLED emitters 1120 that are organized so as to fit within the TLED cavity formed by the TLED tube boundary 1124. A rigid or semi-rigid housing 1126 supports a rigid or flexible substrate 1128 that supports a light-emitting device array 1106. The rigid or flexible substrate 1128 can include printed wiring structures (e.g., traces, thru-holes, connectors, etc.) or other electrically conductive structures disposed on one or both sides of the rigid or flexible substrate.

Figure 11C:
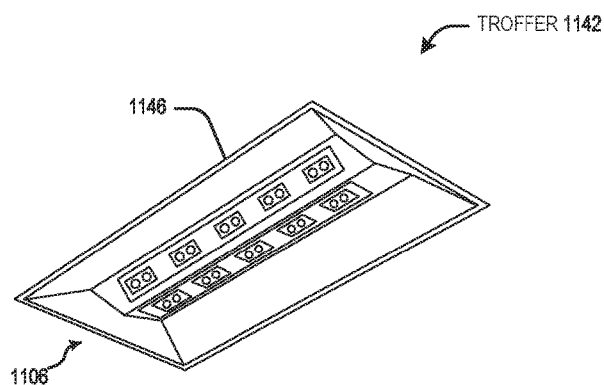

FIG. 11C presents an elevation view of a troffer installation. As shown, the troffer installation 1142 includes a rigid or semi-rigid shaped housing 1146 that supports an array of light-emitting devices. The array of light-emitting devices can be organized into any arrangement, for example and as shown, into an arrangement onto a printed wiring board module 1108 that is disposed within the boundary of the shaped housing. Some troffers might be composed of more (or fewer) instances of light-emitting devices being populated onto the printed wiring board module.

What has been described are approaches for implementing aesthetically-pleasing LED applications by adding a specially-formulated off-state white-appearing layer to the LED apparatus. The white appearing layer is tuned for high-efficiency during the on-state.

Having described the invention in detail, those skilled in the art will appreciate that, given the present disclosure, modifications may be made to the invention without departing from the spirit of the inventive concepts described herein. Therefore, it is not intended that the scope of the invention be limited to the specific embodiments illustrated and described.

What is being claimed is:

1. A structure comprising:
   a semiconductor light emitting device; a wavelength-converting layer disposed over the semiconductor light emitting device; and
   a light-scattering layer disposed over the wavelength-converting layer, the light-scattering layer including a phase-changing material suspended in a binding material, the phase-changing material being arranged to transition from a solid phase into a liquid phase when the light-scattering layer is heated by the semiconductor light emitting device, the phase-changing material having a lower index of refraction in the liquid phase then in the solid phase.

2. The structure of claim 1, wherein:
   the light-scattering layer includes a concentration of scattering agents,
   the binding material has a first index of refraction at a first temperature, and
   the concentration of scattering agents having a second index of refraction at the first temperature, the second index of refraction being lower than the first index of refraction, and the first temperature being in a first range of about 0 degrees Celsius to about 45 degrees Celsius.

3. The structure of claim 2, wherein the binding material has a third index of refraction at a second temperature, the third index of refraction being lower than the first index of refraction.

4. The structure of claim 3, wherein the second temperature is in a second range of about 100 degrees Celsius to about 250 degrees Celsius.

5. The structure of claim 3, wherein at least some of the scattering agents have a fourth index of refraction at the second temperature, the fourth index of refraction being lower than the second index of refraction.

6. The structure of claim 1, wherein the phase-changing material exhibits a first index of refraction at a first temperature that is higher than a second index of refraction at a second temperature, the first temperature being in a first range of about 0 degrees Celsius to about 45 degrees Celsius, and the second temperature is in a second range of about 100 degrees Celsius to about 250 degrees Celsius.

7. The structure of claim 1, further comprising a first reflective structure disposed adjacently to a first sidewall of the semiconductor light emitting device.

8. The structure of claim 7, further comprising a second reflective structure disposed adjacently to a second sidewall of the semiconductor light emitting device.

9. The structure of claim 1, further comprising a concentration of light absorbing particles embedded in the light-scattering layer.

10. The structure of claim 9, wherein the light absorbing particles are black particles.

11. A method comprising:
providing a semiconductor light emitting device;
disposing a wavelength-converting layer over the semiconductor light emitting device; and
disposing a light-scattering layer over the wavelength-converting layer, the light-scattering layer including a phase-changing material suspended in a binding material, the phase-changing material being arranged to transition from a solid phase into a liquid phase when the light-scattering layer is heated by the semiconductor light emitting device, the phase-changing material having a lower index of refraction in the liquid phase then in the solid phase.

12. The method of claim 11, wherein:
the light-scattering layer includes a concentration of scattering agents,
the binding material has a first index of refraction at a first temperature, and
the concentration of scattering agents having a second index of refraction at the first temperature, the second index of refraction being lower than the first index of refraction, and the first temperature being in a first range of about 0 degrees Celsius to about 45 degrees Celsius.

13. The method of claim 12, wherein the binding material has a third index of refraction at a second temperature, the third index of refraction being lower than the first, index of refraction.

14. The method of claim 13, wherein the second temperature is in a second range of about 100 degrees Celsius to about 250 degrees Celsius.

15. The method of claim 13, wherein at least some of the scattering agents have a fourth index of refraction at the second temperature, the fourth index of refraction being lower than the second index of refraction.

* * * * *